United States Patent [19]

Miyamoto et al.

[11] Patent Number: 4,689,770
[45] Date of Patent: Aug. 25, 1987

[54] SEMICONDUCTOR MEMORY DEVICE

[75] Inventors: Hiroshi Miyamoto; Koichiro Mashiko; Toshifumi Kobayashi; Michihiro Yamada, all of Hyogo, Japan

[73] Assignee: Mitsubishi Denki Kabushiki Kaisha, Tokyo, Japan

[21] Appl. No.: 792,071

[22] Filed: Oct. 28, 1985

[30] Foreign Application Priority Data

Oct. 26, 1984 [JP] Japan .................. 59-226294

[51] Int. Cl.$^4$ ............................. G11C 11/24
[52] U.S. Cl. ...................... 365/149; 365/51
[58] Field of Search .......... 365/149, 203, 205, 207, 365/51, 63

[56] References Cited

U.S. PATENT DOCUMENTS 4,506,351  3/1985  Scheuerlein et al. ............. 365/205

FOREIGN PATENT DOCUMENTS 3233632  4/1983  Fed. Rep. of Germany .
3410794  8/1983  Fed. Rep. of Germany .
3247538  9/1984  Fed. Rep. of Germany .

OTHER PUBLICATIONS

L. Arzubi et al., "One-Device Memory Cell Arrangement with Improved Sense Signals", IBM Technical Disclosure Bulletin, vol. 23, No. 6, Nov. 1980, pp. 2331-2332.

IBM Technical Disclosure Bulletin, vol. 23, No. 2, Jul. 1980, A. G. Fortino et al., "Contactless Self-Aligned Memory Process".

Primary Examiner—Joseph A. Popek
Attorney, Agent, or Firm—Sughrue, Mion, Zinn, Macpeak & Seas

[57] ABSTRACT

An LSI semiconductor memory device in which errors in reading out memory cells connected to outermost bit lines of a memory cell array of the device are substantially eliminated. In accordance with the invention, this is done by making capacitances associated with the bit lines of respective ones of the memory cell array substantially equal to one another. To accomplish this, the configuration of an inside portion of wiring other than the bit lines of the array is made the same as that of the bit lines, and the distance between the outermost bit line and the other wiring is made equal to the distance between adjacent ones of the bit lines.

3 Claims, 9 Drawing Figures

SEMICONDUCTOR MEMORY DEVICE

BACKGROUND OF THE INVENTION

The present invention relates to a LSI semiconductor memory device, and particularly to a socalled dynamic random access memory device (referred to as a dynamic RAM hereinafter).

FIG. 1 shows a typical arrangement of a dynamic RAM, in which MCA depicts memory cell arrays, WL word lines, BL bit lines, and SA sense amplifiers. The numbers of the word lines WL and the bit lines BL in each memory cell array MCA depend upon its memory capacity. For clarity of illustration, only a single word line and a single bit line are shown in FIG. 1.

FIG. 2 shows one of the memory cells in the memory cell array MCA in FIG. 1. Such a memory cell is known for example, from Japanese Laid-Open Patent Application No. 58295/1982. In FIG. 2, reference numeral 1 depicts a diffusion layer, 2 a cell plate formed by a first polycrystalline silicon layer, 3 a transfer gate formed by a second polycrystalline silicon layer, BL a bit line made of aluminum, and C a contact connecting the diffusion layer and the bit line. The diffusion layer 1 and the cell plate 2 form a capacitor for the memory cell. The transfer gate 3 functions as the word line in FIG. 1.

FIG. 3 shows the bit line BL and the contacts C in an edge portion of the memory cell array MCA, which is defined by points a, b, c and d in FIG. 2, and aluminum wiring outside the memory cell array. In FIG. 3, $\overline{BL1}$, BL1 and BL2 are bit lines, and C11a, C11b, ..., C21b are contacts connecting the diffusion layer and the bit lines. Reference numeral 4 depicts aluminum wiring which short-circuits the cell plates 2 in FIG. 2 in the edge area of the memory cell array MCA in FIG. 1, and C4a to C4c are contacts connecting the cell plate 2 and the aluminum wiring 4.

In the conventional dynamic RAM shown in FIG. 3, the distance d2 between adjacent bit lines and the distance d1 between the bit line and the bit line of the contact portion are commonly set for every bit line, and the distance d4 between the outermost bit line BL1 and the aluminum wiring 4 disposed outside the outermost bit line BL1 and the distance d3 between the aluminum wiring 4 and the outermost bit line BL1 of the contact portion are set differently from the distances d1 and d2. In the illustrated case, d3 and d4 are smaller than d1 and d2, respectively.

The sense amplifier SA is arranged outside the memory cell array MCA, as shown in FIG. 1. FIG. 4 shows the connections between the bit lines BL1 and $\overline{BL1}$ and a sense amplifier SA composed of insulated gate type n-channel field effect transistors (FETs) QS1 and QS2.

The bit lines BL1 and $\overline{BL1}$ are connected to the drains of the FETs QS1 and QS2, respectively, to the gates of which the bit lines $\overline{BL1}$ and BL1 are connected, respectively. The sources of the FETs are connected commonly to receive a sense amplifier activating signal S. WL1 and WL2 are word lines and DWL1 and DWL2 are dummy word lines. QC1, QC2 and CC1, CC2 are FETs and capacitors, respectively, which constitute the memory cell. QR1 and QR2, which are FETs used for discharging the dummy cells, have gates connected to receive a dummy cell reset signal RST.

To the bit lines BL1 and $\overline{BL1}$, stray capacitors CS10 and CS20 with respect to ground potential and an interline capacitor CS12 between the bit lines BL1 and $\overline{BL1}$ are connected. An interline capacitor CS14 is formed between the outside aluminum wiring 4 and the bit line $\overline{BL1}$, and an interline capacitor CS23 is formed between the bit line BL1 and the adjacent bit line BL2. Since the configurations of the bit lines BL1 and $\overline{BL1}$ are similar, the capacitors CS10 and CS20 have substantially the same capacitance. Further, since the distances d1 and d2 between the adjacent bit lines are different from the distances d3 and d4 between the outermost bit line BL1 of the memory cell and the aluminum wiring 4, the capacitors CS23 and CS14 have different values, namely, CS23<CS14. Therefore, the total capacitance connected to the bit line BL1 is larger than that connected to the bit line $\overline{BL1}$.

The operation of this dynamic RAM will be described with reference to a case where the content of the capacitor CC1 of the memory cell in FIG. 4 is read out under the assumption that the content is "1". Operational waveforms of the bit lines are shown in FIGS. 5A and 5B.

Under the stated conditions, the dummy cell reset signal RST is set to the "H" (high) level, causing the FETs QR1 and QR2 to be turned on and the capacitors CD1 and CD2 to be discharged. Further, the bit lines BL1 and $\overline{BL1}$ are precharged to "H" levels by suitable precharge circuitry (not shown). Then, after the dummy cell reset signal RST becomes "L", the word line WL1 and the dummy word-line DWL2 are set to "H" levels at a time instant $t_0$, causing the FETs QC1 and QD2 to be turned on and thus connecting the capacitors CC1 and CD2 to the bit lines BL1 and $\overline{BL1}$, respectively. It is to be noted that charges on the stray capacitor CS10, those on the interline capacitors CS14 and CS12, and those on the capacitor CC1 are averaged on the bit line BL1, and charges on the stray capacitor CS20, those on the interline capacitors CS23 and CS12, and those on the capacitor CD2 are averaged on the bit line $\overline{BL1}$.

Since the capacitance of the capacitor CC1 of the memory cell is larger than that of the dummy cell capacitor CD2, assuming as above that the memory content of the capacitor CC1 is "1", when the dummy cell capacitor CD2 is discharged (placed in the "0" state), the potential of the bit line BL1 will rise above that of the bit line $\overline{BL1}$. At this time, since the total capacitance of the capacitors connected to the bit line BL1 is larger than the total capacitance of the capacitors connected to the bit line $\overline{BL1}$, the potential of the bit line BL1 (precharged to the "H" level) is hardly varied.

Then, when the sense amplifier drive signal S becomes "L" at a time instant $t_1$ and the sense amplifier is activated, the FETs QS2 and QS1 are turned on and off, respectively, since the potential of the bit line BL1, i.e., the gate potential of the FET QS2, is higher than the potential of the bit line $\overline{BL1}$, i.e., the gate potential of the FET QS1, as shown in FIG. 5A, causing the potential of the bit line $\overline{BL1}$ to be further lowered. Thus, the memory content "1" of the memory cell capacitor CC1 is read out on the bit line BL1.

A reading out operation of a memory content of "0" of the capacitor CC1 will be described. In this case, the discharge of the dummy cell capacitor, the precharging of the bit line, and the operations of setting the word line and the dummy word line to "H" levels are the same as those described previously.

When the capacitors CC1 and CD2 are connected to the bit lines BL1 and $\overline{BL1}$, respectively, the potentials of the bit lines BL1 and $\overline{BL1}$ are both lowered since the memory content of the capacitor CC1 is "0", and the capacitor CD2 has been discharged (set to the "0" state).

As mentioned previously, the cpaacitance of the capacitor CC1 is larger than that of the capacitor CD2, and the capacitors CS14 and CS23 connected to the respective bit lines BL1 and $\overline{BL1}$ satisfy the relation CS14>CS23. If the difference between the capacitances of CS14 and CS23 is large, the potential of the bit line BL1, as shown in FIG. 5B, will fail to fall below that of the bit line $\overline{BL1}$, and thus the FETs QS2 and QS1 are turned on and off, respectively. Therefore, the potential of the bit line BL1 does not follow the dotted line in FIG. 5B, and the potential of the bit line $\overline{BL1}$ is further lowered. As a result, the memory content is read out on the bit line BL1 as a "1", causing an erroneous reading.

Thus, in the conventional semiconductor memory device, erroneous read out is unavoidable for the outermost bit line since the distance between the adjacent bit lines is different from the distance between the outermost bit line and the aluminum wiring outside the latter bit line; that is, the capacitance between the adjacent bit lines is different from the capacitance between the outermost bit line and the wiring, even if the arrangement of bit lines in the memory cell array is symmetrical.

Particularly, in the case where the distance between the outermost bit line and the aluminum wiring is smaller than that between the adjacent bit lines, readout error tends to occur when the capacitor connected to the outermost bit line stores a "0". On the other hand, in the case where the distance between the outermost bit line and the wiring is larger than that between the adjacent bit lines, read-out error tends to occur when the capacitor connected to the outermost bit line stores a "1" since the capacitance connected to the outermost bit line is smaller than that connected to the other bit lines.

This defect becomes more pronounced as the integration density increases due to the decreased distance between adjacent bit lines. That is, with a decrease of the inter-bit line distance, the inter-bit line capacitance is increased with respect to the total bit line capacitance, and when there is an unbalance in the inter-bit line capacitance as mentioned previously, normal readout operations of the dynamic RAM are impossible.

SUMMARY OF THE INVENTION

An object of the present invention is thus to provide a semiconductor memory device in which the above-discussed type of read-out error is eliminated, even in the case where the content of a memory cell connected to the outermost bit line of a memory cell array is read out.

According to the present invention, to achieve the above and other objects, capacitances associated with the respective bit lines of the memory cell array are made substantially equal to each other.

DESCRIPTION OF THE PREFERRED EMBODIMENTS

Figure 1:
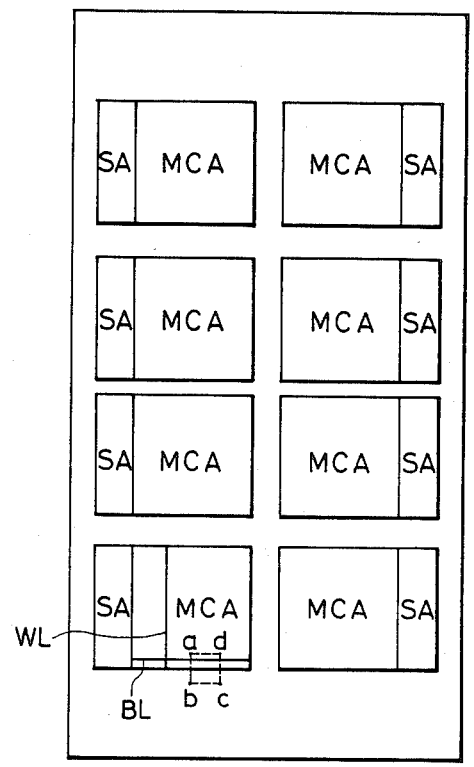
FIG. 1 shows a general arrangement of a dynamic RAM.
Figure 2:
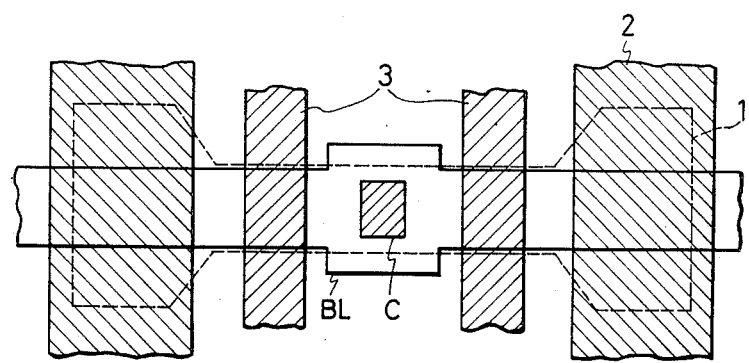
FIG. 2 is a plan view of a memory cell of the dynamic RAM.
Figure 3:
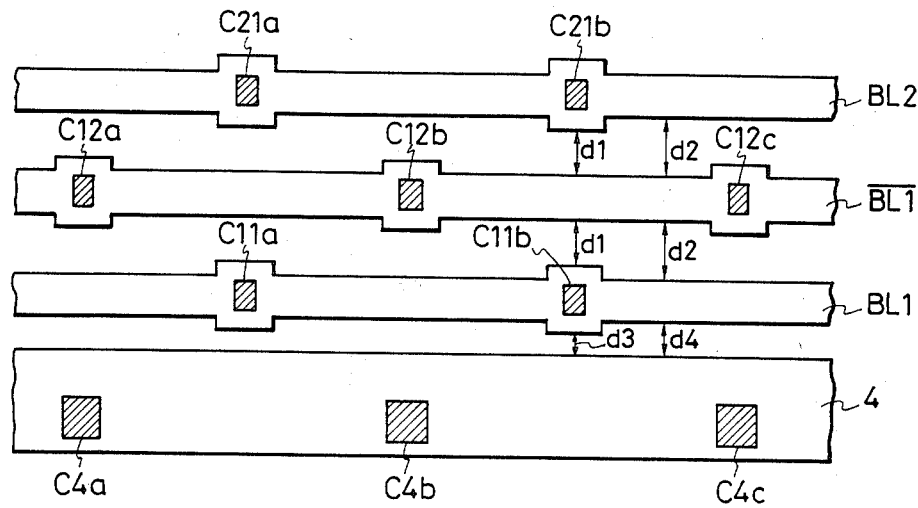
FIG. 3 shows a conventional arrangement of bit lines and the wiring of a portion of the dynamic RAM.
Figure 6:
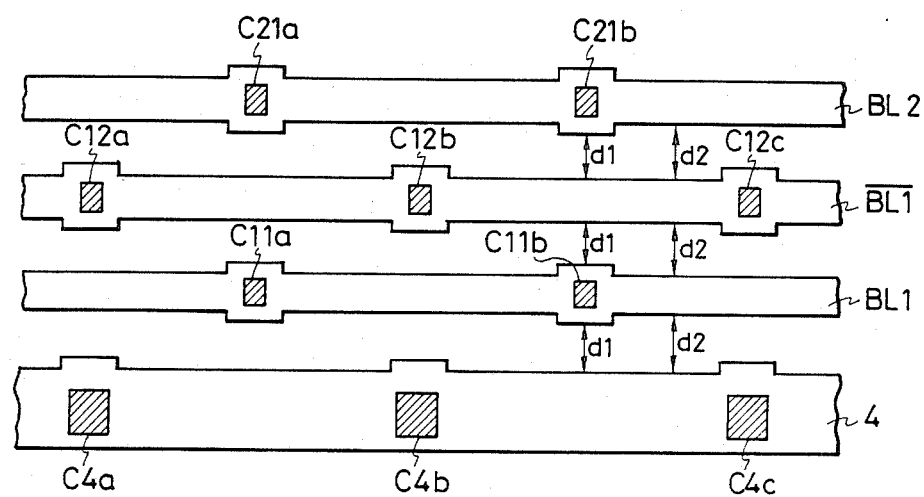
FIG. 6 shows an arrangement of bit lines and the wiring of a portion of a dynamic RAM constructed according to a preferred embodiment of the present invention.

FIG. 6 shows a preferred embodiment of a semiconductor memory device of the present invention. In FIG. 6, which corresponds to FIG. 3 and shows the arrangement of bit lines and wiring in an edge portion of a memory array MCA of a dynamic RAM arranged generally as shown in FIG. 1 and with the edge portion being surrounded by points a, b, c, and d, BL1, $\overline{BL1}$ and BL2 depict bit lines, and C11a, C11b, . . . , C21b contacts connecting the bit lines to diffusion layers. Reference numeral 4 depicts aluminum wiring short-circuiting cell plates 2 (FIG. 2) arranged in an outer portion of the memory cell array MCA.

C4a, . . . , C4c are contacts connecting the cell plate 2 to the aluminum wiring 4. The distance d1 (or d2) between adjacent bit lines is constant, and the distance between the outermost bit line BL1 and the aluminum wiring 4 outside the latter is made equal to the inter-bit line distance.

Figure 4:
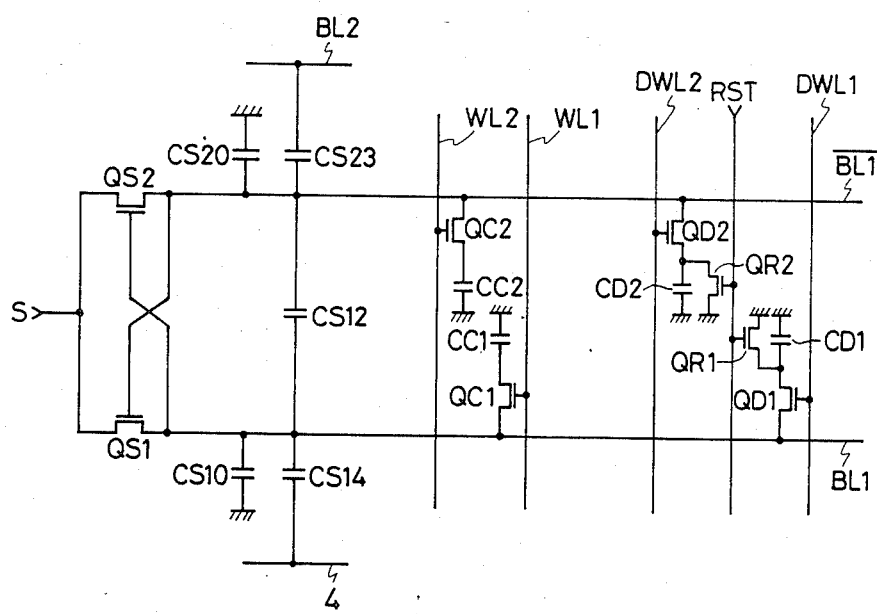
FIG. 4 is a circuit diagram showing connections between the memory cells and sense amplifiers.
Figure 5A:
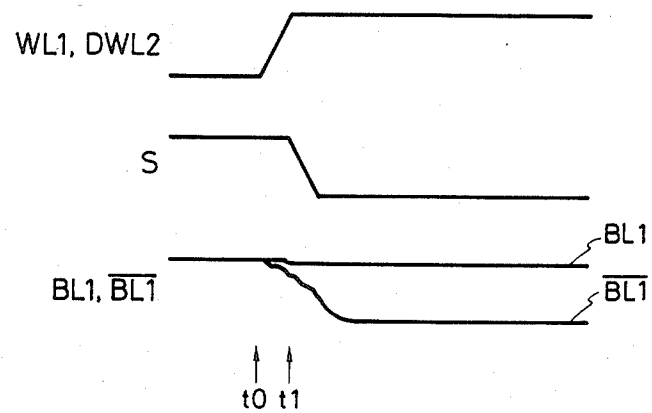
FIGS. 5A and 5B are waveforms showing operations of the conventional dynamic RAM.
Figure 5B:
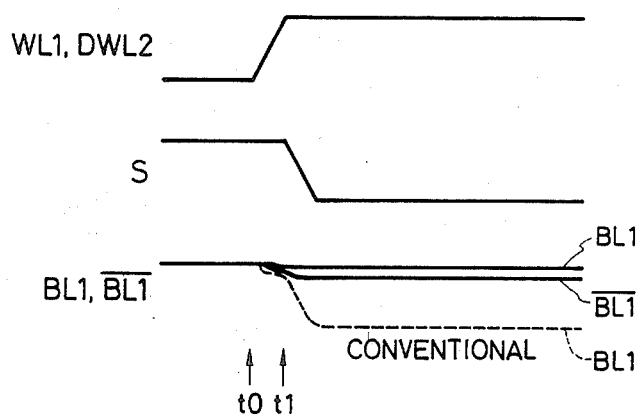

Therefore, in the equivalent circuit shown in FIG. 4, the inter-bit line capacitances CS14 and CS23 connected to the bit lines BL1 and $\overline{BL1}$, respectively, are substantially equal to each other, and thus the total capacitance connected to the bit line BL1 is substantially equal to that connected to the bit line $\overline{BL1}$.

The operation of the dynamic RAM according to the present invention will be described with reference to FIG. 7 which shows operational waveforms of the inventive dynamic RAM for the case where the memory content of the capacitor CC1 of the memory cell in FIG. 4 is to be read out. It is first assumed that the memory content of the capacitor CC1 is "1".

Under these condition, the dummy cell reset signal RST is set to "H" and the FETs QR1 and QR2 are turned on to discharge the capacitors CD1 and CD2. At this time, the bit lines BL1 and $\overline{BL1}$ are precharged to the "H" level as mentioned previously. Then, after the dummy cell reset signal RST returns to "L", the word line WL1 and the dummy word line DWL2 becomes "H" at a time instant $t_0$, and the FETs QC1 and QD2 are turned on to connect the bit line BL1 to the capacitor CC1 and the bit line $\overline{BL1}$ to the capacitor CD2. The charge on the stray capacitor CS10 connected to the bit line BL1, those of the inter-bit line capacitors CS14 and CS12, and the charge on the capacitor CC1 and averaged, while the charge on the stray capacitor CS20 connected to the bit line $\overline{BL1}$, the charge on interbit line capacitors CS23 and CS12, and the charge on the capacitor CD2 are averaged. Thus, the potential of the bit line BL1 becomes higher than that of the bit line $\overline{BL1}$ since the capacitor CC1 of the memory cell is larger than the capacitor CD2 of the dummy cell and the memory content of the capacitor CC1 is "1", and the dummy cell capacitor CD2 has been discharged to a "0" level.

Figure 7A:
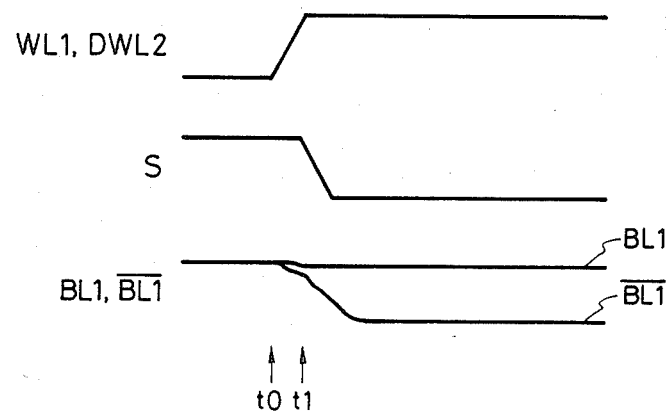
FIGS. 7A and 7B are waveforms showing operations of the present invention.

At a time instant $t_1$, the sense amplifier activating signal S becomes "L" and the amplifier is activated. At this time, since the potential of the bit line BL1, i.e., the gate potential of the FET QS2, is higher than the potential of the bit line $\overline{BL1}$, i.e. the gate potential of the FET QS1, the FETs QS2 and QS1 are turned on and off, respectively. Thus, the potential of the bit line $\overline{BL1}$ is further reduced, as shown in FIG. 7A, and the memory content "1" of the capacitor CC1 is read out on the bit line BL1.

For read out of a content of "0" of the memory cell capacitor CC1, the discharge of the dummy cell capacitor, the precharging of the bit lines, and the establishment of "H" levels of the word lines and the dummy word lines are performed in the same way as described previously.

When the capacitors $\overline{CC1}$ and $\overline{CD2}$ are connected to the bit lines BL1 and $\overline{BL1}$, respectively, the potentials of these bit lines are lowered since the memory content of the capacitor CC1 is "0", and the capacitor CD2 has been discharged to a state corresponding to "0".

Figure 7B:
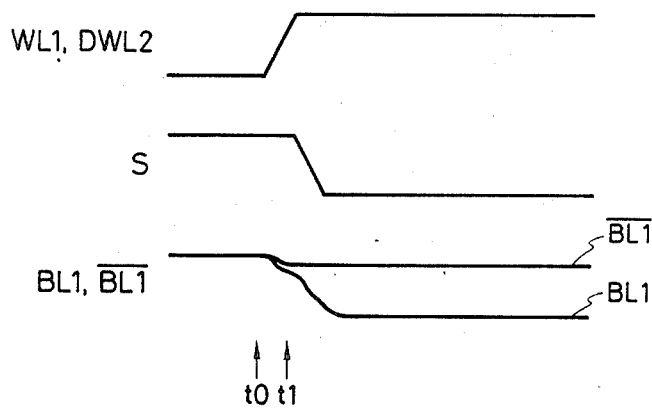

Since the capacitance of the capacitor CC1 is larger than that of the capacitor CD2 and the sums of the stray capacitances and the inter-bit line capacitances associated with the bit lines BL1 and $\overline{BL1}$ are substantially equal to each other, the potential of the bit line BL1 is reliably made lower than that of the bit line $\overline{BL1}$. Therefore, the potential of the bit line BL1 becomes lower than that of the bit line $\overline{BL1}$, as shown in FIG. 7B, and thus the memory content "0" of the capacitor CC1 is read out on the bit line BL1.

Although the bit lines and the other wiring have been described as being made of aluminum, other materials can be used with the same effect. Further, it is not always necessary to form the bit lines and the other wiring of the same material, and the wiring can be formed of materials other than that of the bit lines if the position and edge configuration thereof are selected suitably.

Although the FETs used in the above-described embodiment are of the n-channel type, it is possible to use p-channel type FETs, complementary MOSFETs or bipolar transistors with the same effect. The present invention is not limited in application to a dynamic RAM and can be applied to other memory types such as a static RAM.

As mentioned hereinbefore, according to the present invention, the capacitances associated with the respective bit lines are substantially equalized. Therefore, the error in reading out the contents of the memory cells connected to the outermost bit lines of the memory cell array is eliminated.

We claim:

1. A semiconductor memory device, comprising; a memory cell array including a plurality of memory cells, a plurality of parallel bit lines associated with said array, and a wiring layer arranged in parallel with said bit lines and adjacent said bit lines, adjacent ones of said bit lines defining inter-bit line capacitances, said inter-bit line capacitances being made substantially equal by patterning odd numbered ones of said bit lines and even numbered ones of said bit lines, respectively, in an identical manner, and wherein a last one of said bit lines is disposed adjacent to said wiring layer and together with said wiring layer defines a bit line - wiring layer capacitance, and wherein at least the side of said wiring layer facing said bit lines is patterned identically to the like side of a next-to-last bit line, to thereby render said bit line - wiring layer capacitance substantially equal to each of said inter-bit line capacitances.

2. The semiconductor memory device as claimed in claim 1, wherein said bit lines and said wiring layer are formed of the same material, and wherein a distance between said last one of said bit lines and said wiring layer at any point is equal to a distance between said last one of said bit lines and said next-to-last bit line at the same point.

3. The semiconductor memory device as claimed in claim 2, wherein said material is aluminum.

* * * * *